(12) United States Patent  (10) Patent No.: US 7,795,530 B2
Schröer et al.  (45) Date of Patent: Sep. 14, 2010

(54) SYSTEM FOR CONDUCTING AWAY LIGHTING CURRENTS AND/OR FAULT CURRENTS

(75) Inventors: Jörn Schröer, Herdecke (DE); Gilles Schwaab, Dortmund (DE); Peter Heinz Raidt, Dortmund (DE)

(73) Assignee: Ewald Dörken AG, Herdecke (DE)

( * ) Notice: Subject to any disclaimer, the term of this patent is extended or adjusted under 35 U.S.C. 154(b) by 434 days.

(21) Appl. No.: 11/997,672

(22) PCT Filed: Aug. 3, 2006

(86) PCT No.: PCT/EP2006/007689

§ 371 (c)(1),
(2), (4) Date: Feb. 1, 2008

(87) PCT Pub. No.: WO2007/017178

PCT Pub. Date: Feb. 15, 2007

(65) Prior Publication Data

US 2008/0230249 A1   Sep. 25, 2008

(30) Foreign Application Priority Data

Aug. 5, 2005   (DE) .................... 10 2005 037 670
Oct. 12, 2005  (DE) .................... 10 2005 049 306

(51) Int. Cl.
  *H02G 13/00*   (2006.01)
(52) U.S. Cl. ................ 174/2; 174/3; 174/4 R; 174/6; 174/7; 174/51; 439/98
(58) Field of Classification Search ......... 174/2, 174/4 R, 3, 6, 7, 51; 439/98, 92, 100; 361/216, 361/219, 222
  See application file for complete search history.

(56) References Cited

U.S. PATENT DOCUMENTS 384,384  A  *  6/1888  Nelson ..................... 174/2

(Continued)

FOREIGN PATENT DOCUMENTS

DE   1557383   4/1972

(Continued)

OTHER PUBLICATIONS

International Search Report for International (PCT) Patent Application No. PCT/EP2006/007689, mailed Oct. 2, 2006.

(Continued)

*Primary Examiner*—Dhiru R Patel
(74) *Attorney, Agent, or Firm*—Jason H. Vick; Sheridan Ross, P.C.

(57) ABSTRACT

The invention relates to a system (1) for conducting lightning currents and/or fault currents away from a roof area (2) and/or façade area of a building (3) to the ground (4). According to the invention, the system is equipped with at least one strip (5), which is laid in the roof area (2) and/or façade area of the building (3) and at least one potential compensation system for the building (3). The strip (5) comprises at least one electrically conductive layer for shielding electromagnetic radiation and the strip (5) is connected to the potential compensation system in such a way that lightning currents and/or fault currents can be conducted away via the strip (5) and the building potential to the ground (4). By linking the strip (5) to the potential compensation system of the building (3), lightning currents and/or fault currents, which occur for example when an electric installation malfunctions, can be conducted away in a targeted manner, thus eliminating any risk to persons in the roof area (2) and/or façade area of the building (3).

20 Claims, 3 Drawing Sheets

U.S. PATENT DOCUMENTS

Figure 1:
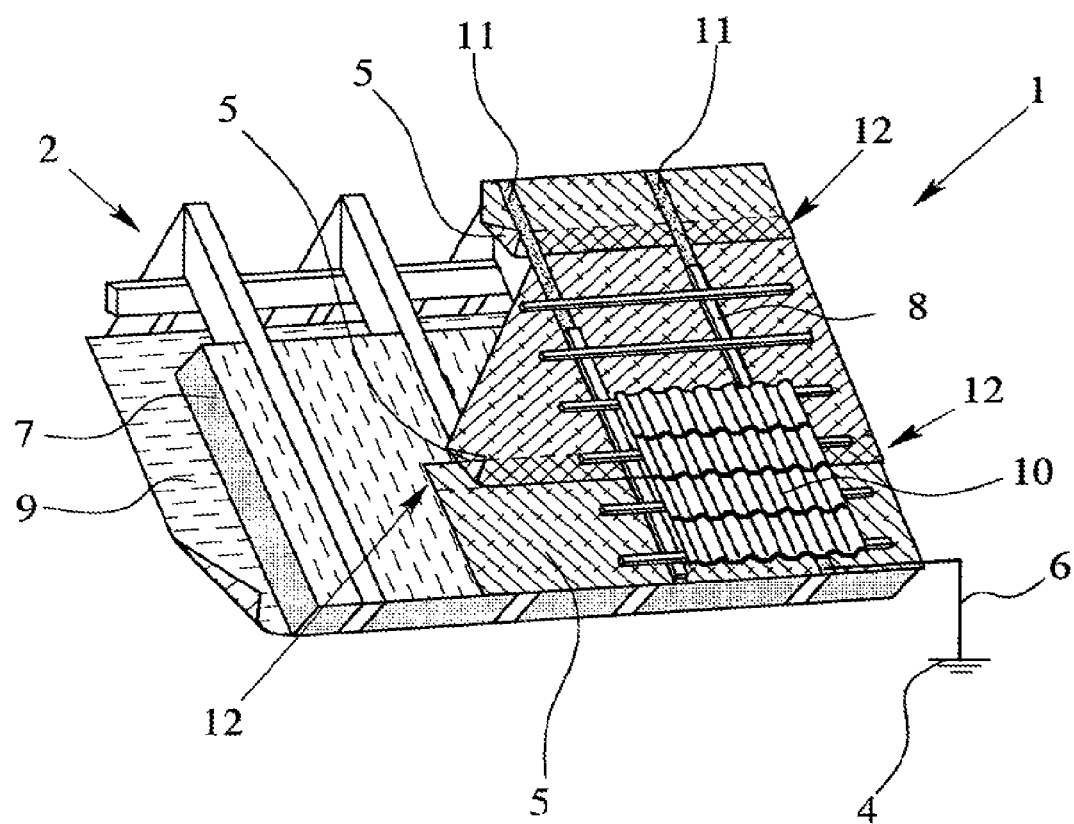

| | | | |
|---|---|---|---|
| 443,048 A | | 12/1890 | Hodges |
| 813,660 A | * | 2/1906 | Miner ............................ 174/2 |
| 2003/0033755 A1 | | 2/2003 | Lord |

FOREIGN PATENT DOCUMENTS

| | | |
|---|---|---|
| DE | 20015514 | 12/2000 |
| DE | 20315042 | 2/2004 |
| DE | 10337792 | 3/2005 |
| WO | WO 2004/049534 * | 10/2004 |

OTHER PUBLICATIONS

Written Opinion for International (PCT) Patent Application No. PCT/EP2006/007689, mailed Oct. 2, 2006.

International Preliminary Report on Patentability for International (PCT) Patent Application No. PCT/EP2006/007689, mailed Feb. 5, 2008.

* cited by examiner

SYSTEM FOR CONDUCTING AWAY LIGHTING CURRENTS AND/OR FAULT CURRENTS

The invention relates to a system for conducting away lightning currents and/or fault currents from a roof area and/or façade area of a building into the ground. The invention further relates to a web with at least one electrically conductive layer to shield electromagnetic radiation from a roof area and/or façade area of a building, with the electrically conductive layer being designed for connection to a potential compensation system.

During the new construction, restoration, re-roofing and the subsequent extension of a roof, reinforced or sub-roof formwork webs, water and/or vapor and/or air barriers or façade webs are used. In addition to the usual functions that such webs have to perform, such as, for example, heat insulation, acoustic insulation, and moisture protection, an electromagnetic shielding in the MHz or GHz range, in particular, is made possible by a conductive web.

A conductive web of the aforementioned type can be a web that contains a metal layer. Metal-layered webs are known as metal-laminated or metal-evaporated webs. Moreover, it is possible that the electrically conductive layer of the web contain carbon particles or fibers, particularly soot and/or graphite and/or an electrically conductive graphite connection. The electrically conductive component of the layer can also be mixed with a binding agent. The web as such can be designed to have a single- or multilayer construction. For example, the web can be a thin metal foil which is applied directly to the undersurface in the roof and/or façade area. Preferably, however, the web has further layers, for example protective and/or reinforcement and/or functional layers. The web can be water-tight and permeable to water vapor as well as weatherproof.

Conductive webs are already known from the prior art. Accordingly, a web having a reflective layer is described in DE 103 37 792 A1 which can be designed to be water-tight, permeable to water vapor and weatherproof. In the known web, electromagnetic radiation is attenuated by the reflective layer. Moreover, it is known to prevent the emission of electromagnetic radiation into the space to be shielded through the reflective layer itself through the application of a potential compensation system in the reflective layer. By virtue of the potential compensation system, the reflective layer is fashioned to be voltage-free, so that the reflective layer itself is not able to conduct the electromagnetic radiation or electromagnetic fields to the space to be shielded in the manner of an antenna.

One disadvantage of the known web is that the potential compensation system set up in the reflective layer is designed to prevent the emission of electromagnetic radiation from the reflective layer itself into the space to be shielded, with the reflective layer having only a slight charge. The setting-up of the potential compensation system prevents the reflective layer from absorbing electromagnetic radiation and then radiating it into the space to be shielded. However, if a lightning strike occurs and the lightning current is conducted onto the conductive reflective layer, then this leads to destruction of the potential compensation system. The consequence of this is that the conductive reflective layer is under tension and hence represents a hazard for people in the roof or façade area in the immediate vicinity of the reflective layer.

Moreover, the interconnected conductive webs constitute a large electrically conductive surface which can come into direct contact with electrical appliances and lines or which must be guided through the electrical lines. For this reason, in the event of faulty electrical installation, it cannot be ruled out that the conductive reflective layer will also be live. Associated with this is an extensive hazard to people in the entire roof and/or façade area, as well as the danger of electric sparks forming. If, given a faulty electrical installation, the conductive reflective layer is also live, this can have as a consequence in the known web containing a reflective layer that the potential compensation system is destroyed and a discharge of voltage does not occur. The hazard to people and the danger of formation of electric sparks hence remain.

It is the object of the present invention to make available a system and a web, each of the type mentioned at the outset, with which it is possible to shield electromagnetic radiation from the roof and/or façade area and to conduct away lightning current and/or fault current from the roof and/or façade area in a safe manner.

The aforementioned object is achieved in a system of the type mentioned at the outset in that at least one web laid in the roof area and/or faade area of a building and at least one building potential compensation system of the building are provided, that the web has at least one electrically conductive layer for shielding electromagnetic radiation and that the web is connected to the potential compensation system for grounding such that lightning current and/or fault current can be conducted away via the web and the potential compensation system. The invention is based on the fundamental idea of treating an electrically conductive web, for example a reinforced web in the roof area, as a so-called external, conductive part and connecting it to the potential compensation system of the building. For this purpose, a provision is made according to the invention that the web is connected to the building's potential compensation system or to a potential compensation conductor for grounding in order to conduct away the lightning current and/or fault current occurring in the event of a lightning strike via the web and the building's potential compensation system into the ground. This presupposes a sufficient dimensioning of the potential compensation conductor so that the potential compensation conductor is not destroyed by lightning current and/or fault current in the event of a lightning strike and/or malfunctions in the electrical installation.

By connecting the conductive web to the potential compensation system of the building, a targeted conducting away of lightning and/or fault current is made available. As a result, it can be ruled out that the conductive web is live in the event of a lightning strike or in the event of malfunctions in the electrical installation. By virtue of the invention, neither a hazard to people nor electric sparks can occur even in the event of a lightning strike or malfunctions in the electrical installation. According to the invention, lightning current and/or fault current is conducted away via the potential compensation system of the building or via a lightning protection potential compensation system and into the ground as an internal lightning protection measure. Here, the potential compensation system of the building or the lightning protection potential compensation system is designed such that even high levels of lightning and/or fault current can be conducted away without any possible destruction of the grounded potential compensation conductor. Accordingly, the web according to the invention can be connected to a building's potential compensation system or to a grounded potential compensation conductor in such a manner that lightning current and/or fault current can be conducted away via the web and the potential compensation system into the ground.

Moreover, by connecting the conductive web to the building's potential compensation system, the bioconstructive effectiveness of the web can be improved in connection with the shielding of electromagnetic radiation. In the case of ungrounded electrically conductive webs connected to each other, it can happen that, as a result of electrical field emissions of electrical lines and devices due to capacitive coupling, a charge imbalance is created, which can have as a consequence that the electrically conductive layer of the web itself radiates electromagnetic radiation like an antenna in the Hz to the KHz range.

In the event of a lightning strike, the lightning current is able to inject into the conductive web and leads to melt-outs at the site of connection as well as at the transitions between adjacent webs and at the connection elements, which are associated with flying electric sparks. As a result of the high ohmic resistance of the web, moving flashovers occur along the surface of the web. Due to the moving flashovers, the lightning current injected into the web is reduced considerably; however, it is still strong enough that damage or even destruction over a large surface of the conductive layer of the web could occur. If the conductive layer of the web is a metal layer, a large surface of the metal may vaporize. The damaging or destruction of the electrically conductive layer has as a consequence that the electromagnetic shielding effect of the web can deteriorate considerably, depending on the frequency range.

In order to prevent the direct injection of lightning current, a provision can be made according to the invention that at least one current arrester connected in an electrically conductive manner having at least one web is provided and that the current arrester is designed such and connected to the web such that lightning current and/or fault current is conducted away substantially via the current arrester and not via the electromagnetic layer of the web to the ground, so that it is effectively not possible for the conductive layer of the web to be destroyed. In connection with the conducting-away of fault currents, in the event of electrical malfunctions, 50 Hz currents with an amperage of up to 16 A can flow over the web and the connection elements. It can therefore not be ruled out that, in the event of an electrical malfunction as well, no damage or destruction of the electrically conductive layer of the web can occur.

Preferably, it is ensured through the electrical current arrester that no direct injection of lightning and/or fault currents into the web can occur at all. In principle, it is of course also possible that the current be first injected into the web but then forwarded and conducted away via the current arrester. In this manner, damage to the electrically conductive layer of the web can be minimized to a large extent.

Preferably, at least one current arrester is directly connected to the building's potential compensation system, so that lightning current and/or fault current can be conducted away directly into the ground via the current arrester and the building's potential compensation system. In this manner, a damaging of the web at the connection points is ruled out to a large extent.

Webs or sections of web that overlap horizontally and/or vertically are preferably connected to each other by means of at least one current arrester. Preferably, it is possible for webs that are laid in the roof area and overlap horizontally to be connected to each other by means of a single current arrester which can extend from the roof ridge to the roof gutter. In the vertical area of overlapping of two web ends, a further current arrester can be provided in order to electrically connect the web ends to each other. As a result of the relatively high ohmic resistances in the overlapping area of adjacent webs or web sections, it is there above all that damage or destruction of the electrically conductive layer of the web occurs in the event of the injection of lightning and/or fault current. The current arrester preferably has a lower ohmic resistance than the web, at least lower than the web in the overlapping area. If the conductive web is under voltage due to a lightning strike or a malfunction in the electrical installation, the current is consequently conducted away substantially via the current arrester and not via the overlapping area of the web. As a result, the heat output that is produced in the overlapping area is reduced as well as the danger of melt-outs of the electrically conductive layer of the web.

The current arrester can extend horizontally and/or vertically to the overlapping area and/or beyond the overlapping area. Here, as much as possible, the distance between the current arresters should be selected such that the injection of lightning current and/or fault current into the web is ruled out as much as possible. However, if lightning current and/or fault current is injected into the web, the current arrester ensures at least that the lightning current and/or fault current is conducted away substantially via the current arrester and not via the overlapping area of the web. This serves the purpose, in turn, of reducing the thermal energy released through the web during the conducting-away of current to the greatest extent possible in order to prevent damage to the electrically conductive layer of the web.

The current arrester can extend on both sides of the overlapping area over an extension of 0.5 m to 1.5 m, preferably of approx. 1.0 m, beyond the overlapping area. In principle, however, it is possible that the current arrester extend from the roof ridge to the gutter and that, preferably, only one current arrester be provided on each roof surface of a roof area. However, it is also possible that a plurality of current arresters be electrically connected to each other in a line and/or in the manner of a network. A sufficiently low-ohmic connection of the adjacent webs or web sections is thus ensured.

A coating, preferably a strip-like foil, can be provided as a current arrester which can have an adhesive layer on at least one side or even on both sides. The current arrester can also be manufactured from the web material as such. For example, it is possible to cut out a preferably strip-like piece from an unlaid web and to use this as a current arrester. If the laid web has an electrically conductive layer on the outer side, then the current arrester can be adhered to the electrically conductive layer on the web. However, a provision is made that the current arrester is laid under counter-battens connected to the roof area and/or to the façade area. In this connection, a flexible intermediate layer can be adhered from below to the counter-battens. Subsequently, the current arrester is adhered to the intermediate layer with the conductive side toward the outside. Finally, the counter-battens are placed with their conductive outer side onto the laid web and affixed to the roof area and/or to the façade area. By virtue of the intermediate layer, unevenness of the undersurface is compensated for and a sufficient electric contact is always ensured. If the web is laid in the roof area, then the counter-battens extend from the roof ridge to the gutter, so that all webs laid on a roof surface of a roof area are electrically connected to each other via the current arrester. The counter-battens extend, nonetheless, at least over the overlapping area of adjacent webs, and the overlapping areas can be arranged directly below the counter-battens.

Moreover, a provision is preferably made that the overlapping areas are mechanically connected to each other, preferably seamed, such that an electric contact is formed between the electrically conductive layers of the overlapping webs or web sections. Through seaming, it is possible, for example, to ensure a sufficient electric contact between the electrically conductive layers of the overlapping webs or web sections, so that it is not necessary to bridge each overlapping area with a current arrester.

To ensure the conducting-away of lightning current and/or fault current, each roof surface of the roof area on which a web is laid can be connected to the ground via at least one potential compensation conductor. For roofs with many small roof surfaces such as, for example, oriels, hipped roofs diagonally across or the like, smaller roof surfaces can be connected directly with larger roof surfaces via a potential compensation conductor, and only the larger roof surfaces can be connected to the ground via one or more further potential compensation conductors of the building's potential compensation system.

In order to ensure a secure conducting-away of lightning current and/or fault current via the potential compensation conductor, the potential compensation conductor should have a cross-sectional surface of at least 1.5 mm$^2$, preferably 2.5 mm$^2$, provided that the potential compensation conductor is sheathed. The sheathing serves to protect against mechanical damage. Unsheathed potential compensation conductors should have a cross-sectional surface of at least 3 mm$^2$, particularly of at least 4 mm$^2$.

To electrically connect the electrically conductive web to the building's potential compensation system or to a potential compensation conductor of the building, a connection element can be provided, with the connection element being preferably connected directly to the current arrester. For example, it is possible that the connection element be clamped or wedged between a web laid in the roof area and/or façade area and a current arrester in order to ensure that there is electrical contact between the web, the current arrester and the building's potential compensation system. However, it is also possible in principle that the connection element only be connected to the electrically conductive layer of the web. For example, a stainless steel plate with a contact surface of 100 cm$^2$ to 200 cm$^2$, preferably of 120 cm$^2$ to 150 cm$^2$, can be provided as a connection element. In connection with the invention, it was discovered that even with a substantially smaller contact surface of 100 cm$^2$ to 200 cm$^2$, preferably of 120 cm$^2$ to 150 cm$^2$, contact can be ensured. In principle, other connection elements, for example an aluminum plate, can also be used. As a protective measure against electric shock, the use of an earth leakage circuit breaker with a release current of 20 mA to 50 mA, preferably of about 30 mA, can further be provided for.

In order to absolutely rule out a hazard to people, a further provision can be made that at least one electrically conductive part and/or an electric device connected to the web or arranged in the area of the web is connected in an electrically conductive manner to the web and/or to the current arrester. Metal parts which penetrate through the conductive web can be connected at the point of penetration to the web and/or to the current arrester. This applies, for example, to antenna standpipes, metal stacks and exhaust pipes, water lines for solar-thermal energy conversion facilities or the like. Elements which are inherently known from the prior art can be used here as connection elements. Metal housings of electric devices which are arranged outside the conductive web can be additionally connected to the conductive web and/or the current arrester. For the sake of simplicity, this can also be done using one or several potential compensation conductors which are carried along with the electric line to the electric device and can be connected at the point of penetration to the web and/or to the current arrester. Here too, tried-and-true elements which are inherently known from the prior art can be used as connection elements. Examples of electric devices that can be connected to the conductive web are lights, satellite antennas, photovoltaics devices, or the like. If metal parts and electric lines that penetrate the web are not connected to the web at the level of the point of penetration, the electromagnetic shielding is also impaired depending on the frequency. Metal housings of electric devices which are arranged directly within the roof and/or façade area to the conductive layer can also be connected to the conductive web and/or to the current arrester.

The electrical installation of a structural arrangement in which the conductive web is to be laid can preferably be constructed in the TN-S network configuration. In this manner, the occurrence of leakage currents in the potential compensation system of the building upon connection of the web to the potential compensation system can be prevented. In the TN-S network configuration, neutral conductors and potential compensation conductors are separate. In this manner, the potential compensation conductor is not loaded by operational currents.

If a structural arrangement has an external lightning protection system, then in the event of a lightning strike the lightning current is intended to be collected by the external lightning protection system, i.e. by lightning and down-conductors, fed to the grounding system and conducted into the ground. In order to rule out an impact of lightning currents on the conductive web to the greatest extent possible, a provision can be made according to the invention that the spacing between electrically conductive parts of the lightning protection device, particularly of lightning conductors and/or down-conductors, and the web is less than 50 cm, preferably between 10 cm and 30 cm. Here, the invention is based on the fundamental idea that the electrically conductive web be laid with spacing vis-à-vis the lightning protection system such that no coupling of lightning currents into the conductive web can occur. In this manner, melt-outs in connection with flying electric sparks can be prevented. Here, it must be kept in mind that a deterioration of the electromagnetic shielding effect of the web can occur as a result of melt-outs of the electrically conductive web. A direct injection of the lightning current must therefore be prevented to the greatest extent possible.

In detail, there are a great number of possibilities for designing and modifying the system according to the invention. We refer here to the dependent claims on the one hand and to the following detailed description of preferred sample embodiments of the invention with reference to the drawing on the other hand. Moreover, the invention allows, as needed, for the combination of the features named in the claims and/or disclosed by means of the drawing and described in the following with each other, even if this is not described in detail. The invention is, furthermore, not limited to the embodiments depicted and described.

Figure 2:
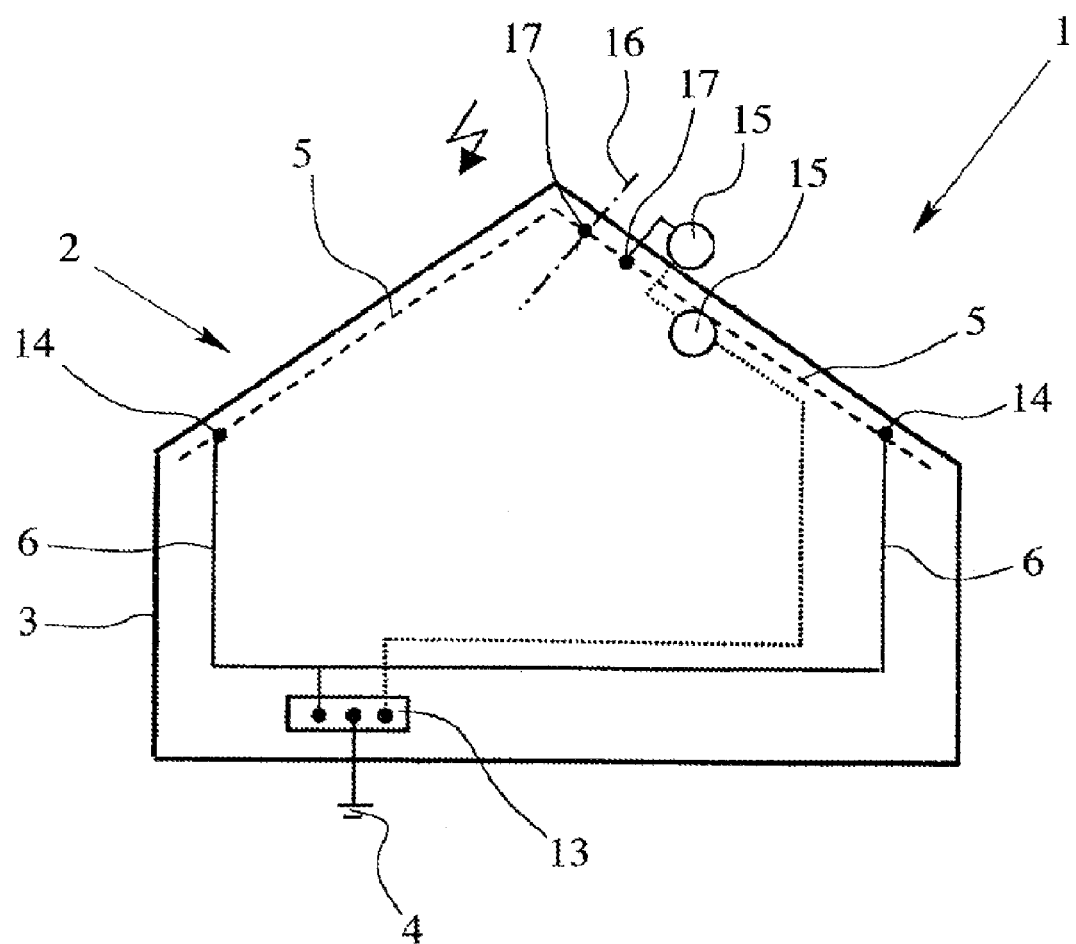
Figure 3:
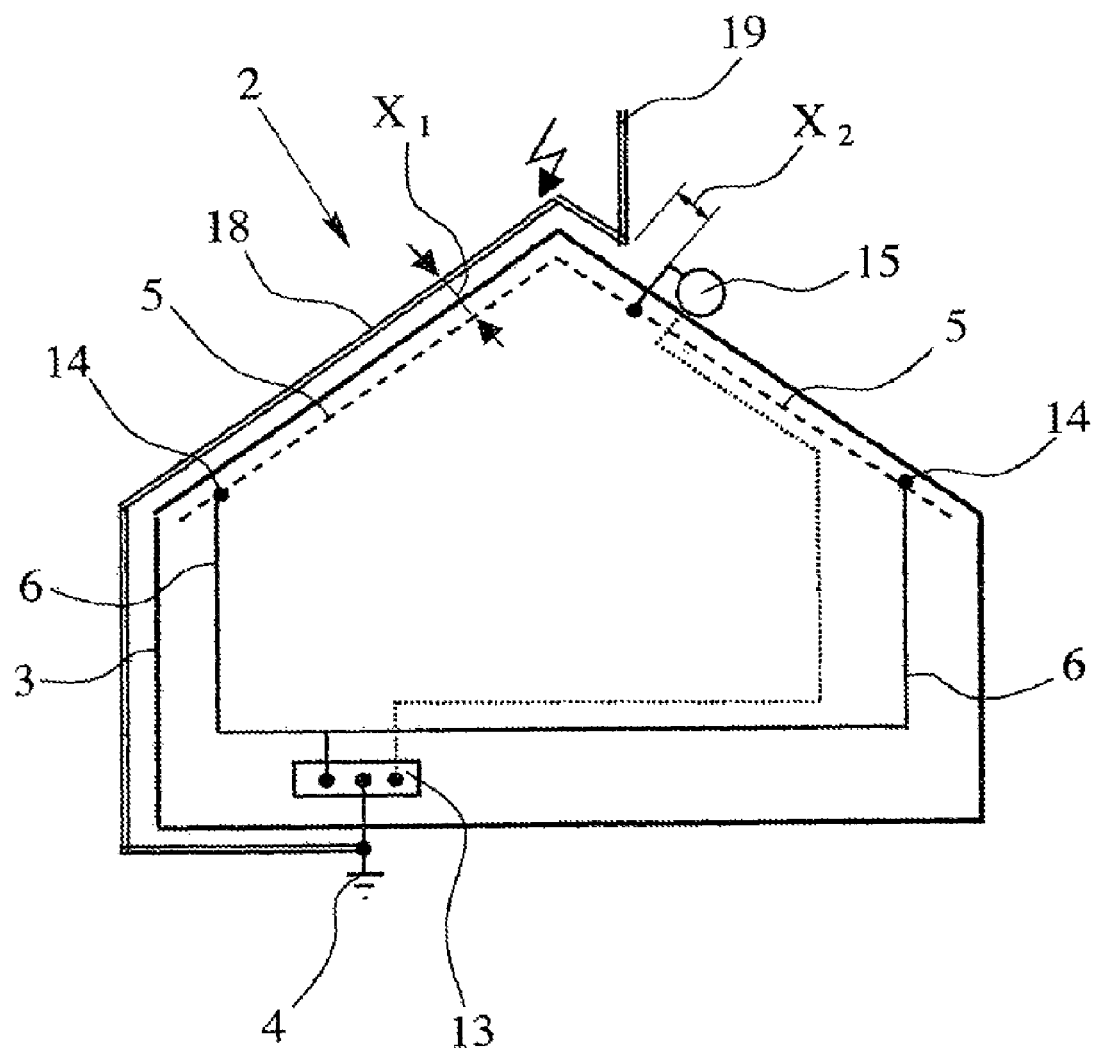

In the drawing,

FIG. 1 shows a schematic partial sectional illustration of a roof construction of a building, FIG. 2 shows a building with a conductive web laid in the roof area for shielding electromagnetic radiation, and FIG. 3 shows the building depicted in FIG. 2 with an external lightning protection system.

Depicted schematically in FIG. 1 is a system 1 according to the invention for conducting away lightning currents and/or fault currents from the roof area 2 of a building 3 into the ground 4. The system 1 has in the roof area 2 a conductive reinforced or sub-roof formwork web 5 and at least one potential compensation conductor 6 of a building's potential compensation system. In the depicted example, the conductive web 5 is provided above an insulation 7 and below counter-battens 8. Provided underneath the insulation 7 on the inside of the roof area 2 is a vapor barrier 9. Tile roofing 10, which is represented only schematically in FIG. 1, can be provided on the counter-battens 8.

The conductive web 5 has at least one electrically conductive layer on the outside for shielding of electromagnetic radiation. According to the invention, a provision is made to conduct away lightning currents and/or fault currents from the roof area 2 of the building 3 that lightning currents and/or fault currents can be conducted via the web 5 and the potential compensation conductor 6 into the ground 4. Through the connection of the conductive web 5 to the potential compensation system of the building 3, lightning currents and/or fault currents, which can be the consequence of a faulty electrical installation, for example, are provided with a targeted conductor, so that it is not possible, either in the event of a lightning strike or of malfunctions in the electrical installation, for the conductive webs 5 to be live. Consequently, an extensive hazard to people in the roof area 2 and the danger of the formation of electric sparks are reduced considerably. Here, the invention is based on the fundamental idea of treating the webs 5 as "external conductive parts" and connecting these to the building's potential compensation system.

The webs 5 are connected to each other in an electrically conductive manner through current arresters 11, where the current arresters 11 can extend from the roof ridge to the roof gutter. In principle, it may be sufficient for an electrical contact of the web 5 to provide one current arrester 11 on each half of the roof. The current arrester 11 can be a conductive foil strip or strip-like sections of a web 5 laid underneath the counter-battens 8. For this purpose, a provision is made that a flexible substrate is first adhered to the counter-battens 8 from below. The flexible substrate can be a sealing strip. The current arrester 11 is adhered to the flexible substrate, with the electrically conductive side of the current arrester 11 being oriented toward the outside or downward. Then, the thus-modified counter-battens 8 are affixed to the roof area 2 such that the webs 5 are electrically connected via the current arrester 11. Since damage is possible to the electrically conductive layer in the coupled-in area, and particularly at the transitions to adjacent webs, in the event of lightning currents and/or fault currents into the web 5, the webs 5 are connected to each other preferably horizontally and, optionally, vertically by means of conductive connections at least in the overlapping area. Due to the lower electrical resistance of the current arrester 11, in the event of a lightning strike or the injection of fault currents, the currents are conducted away substantially via the current arrester 11 and not via the web 5. In this manner, damage to the conductive layer of the web 5 can be prevented to a great extent.

As follows from FIG. 1, at least one current arrester 11 is connected to the potential compensation conductor 6 and to the building's potential compensation system. The conducting of lightning currents and/or fault currents from the roof area 2 to the ground 4 is thus ensured. For example, a connection element that is connected to the potential compensation conductor 6 can be clamped between a web 5 and a current arrester 11 or the counter-battens 8.

Since a vaporization over a large surface of the conductive material of the web 5 can occur in the event that lightning currents and/or fault currents are conducted, particularly in the overlapping areas 12 of adjacent webs 5, due to the comparably high electrical resistance in this area, the horizontal overlapping areas 12 per FIG. 1 are connected in an electrically conductive manner to each other via a plurality of vertically extending current arresters 11. Preferably, a provision is made that the current arresters 11 extend on both sides of an overlapping area 12 at least beyond an extension of preferably about one meter over the overlapping area 12. Preferably, a connection of several adjacent webs is provided for in a line by means of a current arrester 11, and the current arrester 11 can extend from the roof ridge to the roof gutter over the roof area 2. Here, a plurality of current arresters 11 are arranged next to each other over the entire length of the roof area 2. By virtue of the current arresters 11, a sufficiently low-ohmic connection of the webs 5 is ensured.

When a web 5 ends, a vertical conductive connection between the beginning of a new web 5 and the end of a terminating web 5 can be ensured by means of a current arrester 11. The current arrester 11 can be affixed with the aid of counter-battens 8 arranged above it, and the overlapping area can be arranged directly below the counter-battens 8. In turn, a conductive foil strip or a strip-like section of a web 5 can be provided as a current arrester 11 in order to prepare a conductive connection with low resistance. The web end and the web beginning of adjacent webs 5 can additionally be overlapped and seamed, so that an electrical contact of the conductive layers of the webs 5 can be ensured by seaming of the overlapping areas. As a result, a plurality of current arresters 11 can be connected to each other in an electrically conductive manner in a line and/or in the manner of a network in order to rule out the injection of lightning currents and/or fault currents to the greatest extent possible, at least in the overlapping area 12 of adjacent webs 5.

According to FIG. 1, the web 5 can be connected via the current arrester 11 to the potential compensation conductor 6. A conducting of lightning currents and/or fault currents into the ground 4 is thus ensured. The potential compensation conductor 6 is a part of the potential compensation system of the building 3, which is illustrated particularly in FIG. 2. The potential compensation conductor 6 is fed to a potential compensation rail 13, which is connected to the ground 4.

According to FIG. 2, each roof surface of the roof area 2 is connected to the potential compensation rail 13 via at least one potential compensation conductor 6. Preferably, the potential compensation conductors 6 are connected with the aid of the counter-battens 8 to at least one current arrester 11 each on each roof surface. A stainless steel plate with a contact surface of approx. 120 cm$^2$ or less can be provided as a connection element 14. Internal or external electrical devices 15 and/or conductive parts 16 which penetrate the web 5 or the roofing are preferably connected at the level of the point of penetration to the conductive web 5 or a current arrester 11 via suitable connection elements 17.

Through the aforementioned measures, it is ensured that the use of conductive webs 5 in the roof area 2 and/or in the façade area does not lead to any increased risk. This applies both to the case of a direct lightning strike and to malfunctions in the electrical installation. Moreover, the system 1 according to the invention can also be used in connection with metal roofs, which can be used as natural components of an external lightning protection system.

The building 3 shown in FIG. 2 is represented in FIG. 3, with the building 3 having an external lightning protection system 18. The external lightning protection system 18 has lightning conduction devices which are not shown individually, conductors and a grounding installation per the valid standards. In the case of a lightning strike, lightning current is intended to be collected by the external lightning current system 18, and conducted away into the ground 4. In order to rule out the effect of lightning currents on the conductive web 5 to the greatest extent possible, a provision is made that the web 5 is laid such that it is spaced with a minimum separation distance $X_1$ from lightning conductors and down-conductors (not shown in detail) of the external lightning protection system 18. Moreover, lightning conductors and down-conductors, for example a lightning rod 19 of the lightning protection system 18 which can be provided to protect roof superstructures, for example on an antenna, must be spaced with a sufficient separation distance $X_2$ from an electrical device 15 and/or conductive parts of the building 3. The electrical devices 15 can include roof antennas or photovoltaic and solar-thermal energy conversion devices or the like, for example.

If the separation distance between lightning conductors and down-conductors of the external lightning current system 18 and the webs 5 is maintained, eddy currents are produced in the event of a lightning strike as a result of the lightning current flowing into the areas of the web 5 lying immediately thereunder with a separation distance on the order of a few 10 cm to several 10 cm through coupling. However, even directly under a conductor of the lightning protection system 18 which is conducting lightning current, these have only maximum values of a few 100 A to a few kA. Moreover, these eddy currents are short-term current pulses which decay very quickly. The danger of an impairment of the electromagnetic shielding effect of the web 5 as a result of damage to the electrically conductive layer of the web 5 is therefore very slight.

The separation distance $X_{1,2}$ can be calculated from the following equation $$X_{1,2} = k_i \cdot \frac{k_c}{k_m} \cdot L$$

with the parameters
- $k_i$: Factor for consideration of the lightning protection class of the lightning protection system 18,
- $k_c$: Factor for consideration of the geometry of the lightning protection system 18,
- $k_m$: Factor for consideration of the material of the electrical insulation, and
- L: Distance from the site of potential compensation to the point of separation.

If, in the place of arresters, a metal roof is used as a natural arrester, it is likewise necessary to maintain a separation distance $X_{1,2}$ between the metal roof and the web 5. By means of this measure, it is ensured that the use of conductive webs 5 cannot lead to any increased risk to people or of damages.

Two sample embodiments of the invention are described in the following.

SAMPLE EMBODIMENT 1

The first sample embodiment relates to a single-family home with a ridge roof comprised of two ridge roof halves, with the ridge roof having a rafter length of 8 m, a roof width of 14 m and a rafter spacing of 0.5 m. This results in a roof surface of each ridge roof half of 112 m². The slope of the roof is 40°. Furthermore, the roof is penetrated by a metal chimney and an antenna standpipe. The roof is covered with concrete brick roofing tiles and has full rafter insulation. Provided on the inside is a vapor barrier of the DELTA-LUXX type, which is in fact used by the applicant, a working plane and a gypsum cardboard plate facing. A non-vapor-retardant sub-roof formwork web is provided on the rafters with an $S_d$ value of approx. 0.15 m. The sub-roof formwork web has a conductive, corrosion-resistant outer coating and provides for protection against radiation in the low-frequency range of 20 dB to 50 Hz, with the sub-roof formwork web having to be connected to a potential compensation system in order to be bioconstructively effective. The electromagnetic shielding by the sub-roof formwork web is 21 dB at 1.9 GHz. The surface resistance of the sub-roof formwork web is less than 4 $\Omega m^2$. The width of the sub-roof formwork web is 1.5 m, with the length of the sub-roof formwork web being 50 linear meters/roll.

Structural arrangements are provided inside the single-family house that are not connected to an external lightning protection system. According to the invention, a provision is made that the conductive sub-roof formwork webs are linked to the house's potential compensation system. For this purpose, a provision is first made to connect the sub-roof formwork webs to each other at horizontal overlapping areas and/or at vertical overlapping areas. The horizontal overlapping areas have a width of 10 to 15 cm, with six webs of the sub-roof formwork web being laid in the horizontal direction on each roof ridge surface, i.e. on each side of the roof. As a result, five horizontal overlapping areas have to be connected to each other on each side of the roof. The overlapping areas are seamed, hence achieving an electrical contact between the overlapping webs.

A provision is made that a current arrester is laid under counter-battens on each side of the roof in order to connect the laid sub-roof formwork webs. The current arrester preferably runs from the roof ridge to the roof gutter, so that a continuous electrical connection of the webs is ensured. For this purpose, a flexible substrate of the DELTA-NB 50 sealing strip type, which is in fact used by the applicant, is adhered to the counter-battens. An adhesive strip made of aluminum and having a width of 50 mm is affixed to the sealing strip. The metallic side is oriented toward the outside. The thus-modified counter-battens are affixed to the roof with the metallic side, with the current arrester being electrically contacted by the sub-roof formwork web. Then, the last web is pulled over the ridge.

In the present sample embodiment, a vertical overlapping area of two adjacent web ends is provided on each side of the roof. The two web ends are overlapped on a rafter and seamed, hence forming an electrical contact between the overlapping webs. In addition, modified counter-battens of the aforedescribed type are provided in the vertical overlapping area.

The transfer resistance in the area of vertical and horizontal overlapping is less than 4 $\Omega/m^2$.

Finally, the sub-roof formwork web provided in the area of the gutter is connected to a potential compensation conductor of the building with a stainless steel plate, with the stainless steel plate being fixed between the sub-roof formwork web and the electrically conductive counter-battens. The stainless steel plate has a thickness of 0.3 mm, a length of 240 mm and a width of 80 mm. The contact surface in the area of the counter-battens is 120 cm², though the contact surface can also be much smaller. A terminal connection of the conductive sub-roof formwork web provided in the gutter area to the potential compensation system of the building is provided on each side of the roof. In the case of a sheathed potential compensation conductor, the cross-section of the conductor is 2.5 mm. The two potential compensation conductors, namely one potential compensation conductor on each side of the roof, are fed to the nearest potential compensation rail and connected to same. The electrical installation is provided with a fault current protection breaker with a tripping current of 30 mA. To connect the metal chimney and the antenna standpipe, a provision is made to rig, at the level of the metal chimney or of the antenna standpipe, a stainless steel plate of the aforedescribed type as a connection element between the sub-roof formwork web and the current arrester or the electrically conductive counter-battens and to connect the stainless steel plate via an electrical line to the metal chimney and/or to the antenna standpipe.

SAMPLE EMBODIMENT 2

The second sample embodiment relates to a multi-family house with a pointed dormer and a ridge dormer, with the total surface being about 450 m² and the slope of the roof being about 40°. The roof of the house has four ridged roof surfaces and one hipped roof surface. The pointed dormer is provided in the area of the hipped roof surface and the ridge dormer in the area of the ridged roof surface. Moreover, full rafter insulation is provided under formwork, with the roof being covered with clay tiles. The roof is penetrated by an antenna standpipe and a photovoltaic device. Provided inside the roof is a vapor barrier of the DELTA-REFLEX type as well as a work level and a gypsum cardboard plate facing. A non-vapor-retardant formwork web is provided on the formwork with an $S_d$ value of approx. 0.05 m. The formwork web has a conductive, corrosion-resistant outer coating. By connecting the formwork web to the potential compensation system of the building, protection against radiation in the low-frequency range of 20 dB to 50 Hz is possible. The electromagnetic shielding of the formwork web is 21 dB at 1.9 GHz, and the surface resistance is less than 4 $\Omega m^2$. The web has a width of 1.5 m and a length of 50 linear meters/roll.

Structural arrangements are provided in the house which are connected to an external lightning protection system. The electrical installation is constructed in the TN-S network configuration. A linking of the conductive formwork web to the potential compensation system of the building is required. The webs laid on the roof are connected to each other in vertical and/or horizontal overlapping areas, with the horizontal overlapping areas having a width of 10 cm to 50 cm. Each ridged roof surface has a current arrester which is laid under counter-battens. Here, a flexible substrate, for example of the DELTA-NB 50 sealing strip type, which is in fact used by the applicant, is adhered to the underside of the counter-battens. A strip of the formwork web having a width of 50 mm is adhered to the flexible substrate. The conductive side of the strip adhered to the counter-battens is oriented toward the outside. The counter-battens are connected and electrically contacted via the conductive side to the formwork webs of the roof, with the counter-battens being affixed to the roof. Again, the current arrester preferably runs from the roof ridge to the roof gutter, resulting in a continuous electrical connection of the webs.

Moreover, a provision is made that vertical overlapping areas of adjacent webs are seamed. Through the seaming of the overlapping web ends, an electrical contact in the overlapping area is ensured. Subsequently, modified counter-battens of the aforedescribed type are connected in the vertical overlapping area.

On each ridged roof surface, the conductive formwork web laid in the gutter area is connected to a potential compensation conductor via an aluminum plate with a thickness of 0.4 mm. The aluminum plate can have a length of 200 mm and a width of 50 mm. The contact surface below the counter-battens can be 100 cm². The contact surface can be much smaller, however.

The formwork webs installed on the roof surfaces of the pointed and ridge dormers are each connected in a conductive manner to each other and via comparably short potential compensation conductors to the larger roof surfaces. For example, it is possible to connect a roof surface of the pointed dormer to the hipped roof surface, whereas a roof surface of the ridged dormer is connected to the ridged roof surface having the ridged dormer. Moreover, an electrical potential compensation conductor is provided between the hipped roof surface and a ridged roof surface.

The potential compensation conductor is not sheathed and has a cross-section of 4 mm. The potential compensation conductors emanating from the four ridge roof surfaces of the roof are fed to the nearest potential compensation rail and connected to same. Again, the electrical installation has a fault current protection breaker with a tripping current of 30 mA.

To connect the antenna standpipe and the photovoltaic device, a provision is made to fix an aluminum plate of the aforedescribed type between the formwork web and the current arrester or the modified electrically conductive counter-battens at the level of the antenna standpipe and/or the photovoltaic device. The aluminum plate is connected via electrical conductors to the metal housing of the photovoltaic device and/or to the antenna standpipe. Moreover, the photovoltaic device is protected by the external lightning protection system, and further lightning conduction devices of the external lightning protection system can be provided. The separation distance between the lightning conduction devices of the external lightning protection system and the metal or electric devices, for example the conductive formwork web, complies with the specifications per DIN VDE 0100-540 and DIN EN 62305-3.

The invention claimed is:

1. A system that conducts away one or more of lightning currents and fault currents from one or more of a roof area and façade area of a building into a ground, wherein at least one web laid within the one or more of the roof area and façade area of the building and at least one building potential compensation system of the building are provided, wherein the web has at least one electrically conductive layer that covers at least a portion of the roof for shielding electromagnetic radiation and wherein the web is connected for grounding to the building potential compensation system such that the one or more of lightning currents and fault currents can be conducted away via both the web and the building potential compensation system into the ground.

2. The system as set forth in claim 1, wherein at least one current arrester connected in an electrically conductive manner to the at least one web is provided and the current arrester is connectable to the web such that the one or more of lightning currents and fault currents are conducted away via the current arrester and not via the electrically conductive layer of the web to the ground, wherein substantially no destruction of the conductive layer of the web occurs in the event of the one or more of lightning currents and fault currents.

3. The system as set forth in claim 1, wherein at least one current arrester is connected to the building potential compensation system.

4. The system as set forth in claim 1, wherein overlapping webs are connected to each other via at least one current arrester.

5. The system as set forth in claim 1, wherein a current arrester extends one or more of horizontally and vertically to one or more of an overlapping area and beyond the overlapping area.

6. The system as set forth in claim 1, wherein a current arrester extends on both sides of an overlapping area over an extension of 0.5 m (meters) to 1.5 m beyond the overlapping area.

7. The system as set forth in claim 1, wherein a current arrester extends from a roof ridge to a roof gutter and said a current arrester is provided on every roof surface of a roof area.

8. The system as set forth in claim 1, wherein a plurality of current arresters are electrically connected to each other in one or more of a line and in a network.

9. The system as set forth in claim 1, wherein a conductive coating adherable onto the web is provided as a current arrester.

10. The system as set forth in claim 1, wherein a current arrester is provided beneath counter-battens connected to the web.

11. The system as set forth in claim 1, wherein a plurality of webs are mechanically connected to each other in an overlapping area such that an electrical contact is produced between electrically conductive layers of the plurality of webs.

12. The system as set forth in claim 1, wherein said roof area has a plurality of roof surfaces on which the web is laid, and that each roof surface of the roof area is connected to the ground via at least one potential compensation conductor.

13. The system as set forth in claim 1, wherein at least one roof surface is directly connected to at least one further roof surface via at least one potential compensation conductor and only the further roof surface is connected via at least one further potential compensation conductor to the ground.

14. The system as set forth in claim 1, wherein a potential compensation conductor has a protective sheathing and a cross-sectional surface of between 1.5 mm$^2$ (square millimeters) and 2.5 mm$^2$, or the potential compensation conductor is not sheathed and has a cross-sectional surface of between 3 mm$^2$ and 4 mm$^2$.

15. The system as set forth in claim 1, wherein at least one connection element for electrically connecting a potential compensation conductor to the web is provided and a metal plate with a contact surface of 100 mm$^2$ (square millimeters) to 200 mm$^2$ is provided as a connection element.

16. The system as set forth in claim 1, wherein a fault current protection breaker is provided and the fault current protection breaker is for a tripping current of 20 mA (milliamps) to 50 mA.

17. The system as set forth in claim 1, wherein at least one of one or more of an electrically conductive part and electrical device connected to the web or arranged in the vicinity of the web is connected to one or more of the web and to a current arrester in an electrically conductive manner.

18. The system as set forth in claim 1, wherein an electrical installation of the building is constructed in a network configuration wherein neutral conductors and potential compensation conductors are separate.

19. The system as set forth in claim 1, wherein an external lightning protection device is provided and that the separation distance ($X_1$) between electrically conductive parts of the lightning protection device and the web is less than 50 cm (centimeters).

20. A web comprising at least one electrically conductive layer to shield electromagnetic radiation from one or more of a roof area and façade area of a building, wherein the at least one electrically conductive layer is laid within the one or more of the roof area and façade area of the building, wherein the electrically conductive layer is connectable to a potential compensation system, wherein the web is connectable to the potential compensation system of the building such that one or more of lightning currents and fault currents can be conducted away via the web and the potential compensation system into a ground.

* * * * *